July 23, 1963 J. H. KUCK 3,098,982
SUPERREGENERATIVE AMPLIFIER
Filed July 21, 1959
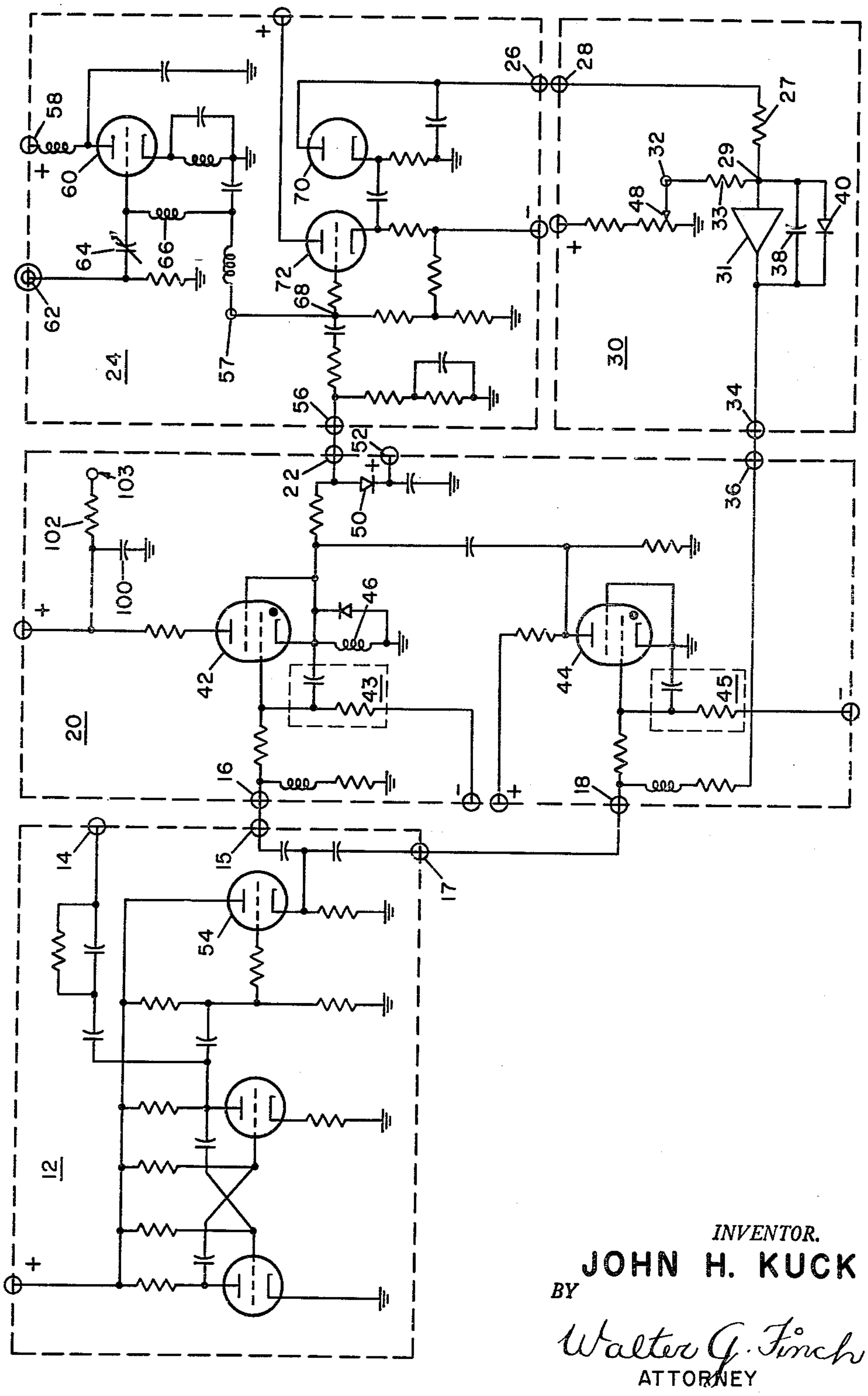
INVENTOR.
JOHN H. KUCK
BY Walter G. Finch
ATTORNEY 3,098,982

SUPERREGENERATIVE AMPLIFIER

John H. Kuck, Silver Spring, Md., assignor of fifty percent to Walter G. Finch, Baltimore, Md.

Filed July 21, 1959, Ser. No. 828,617
6 Claims. (Cl. 332—31)

This invention relates generally to radio frequency amplifiers, and more particularly it pertains to an automatic gain controlled superregenerative amplifier circuit.

Automatic gain controlled circuits for superregenerative amplifiers have previously been designed which control the average level of grid bias on the superregenerative oscillator in such a way that the buildup rate of the oscillation is varied as a method of gain control. This is an effective method of controlling the threshold gain of such an amplifier so that it will have maximum usable sensitivity as an alarm device to indicate the presence or absence of a suddenly applied signal.

However, the oscillator bias method of automatic gain control (AGC) is not well adapted to applications where linear detection of modulation or accurate resolution of pulsed signals by means of the gating effect of the superregenerative amplifier is desired because the effective bandwidth and gate resolution of such an amplifier are strong functions of the input signal level. In addition, it is difficult to design an AGC loop having fairly constant AGC loop gain and bandwidth over a wide range of signal levels.

The superregenerative principle has attractive advantages if used as an intermediate frequency or radio frequency amplifier, namely simplification, ease of alignment, reduction of number of tubes, and low cost of construction. However, for such a circuit to have any value as a linear amplifier for such application, an AGC circuit is required in order to stabilize the circuit and permit the amplifier to handle a large dynamic range of input signal levels without overload. This is necessary for efficient linear detection of an amplitude modulation envelope on the input signal.

It is also desirable that, if an input signal has a fixed percentage of modulation, the detected modulation output should remain nearly constant in amplitude over a wide range of average input signal levels.

A pulsed superregenerative amplifier is an oscillator which is turned off and on by a keying pulse in such a way that the on-time is shorter than the time required for oscillations to build up to saturation level. In such a condition, the peak amplitude to which the oscillations build up is directly proportional to the amplitude of any externally applied signal that exists in the tank circuit during a very short interval of time lasting from the instant that the keying pulse is first applied until the oscillation amplitude has built up to a level which is large compared to the externally applied signal.

Thus, the oscillator is a very high gain amplifier for signals appearing during the sensitive interval. This sensitive interval may be considered to be a gate operating on the input signal. If the keying pulse generator is so constructed that the keying pulse width can be varied by a control voltage, the maximum amplitude to which the oscillations build up and, therefore, the gain of this amplifier will be varied by said control voltage. Therefore an electronic gain control mechanism is obtained by which it is possible to vary gain over almost the full range from unity to its maximum value. This maximum value of gain is the ratio of the maximum output that the oscillator can deliver to the input noise level.

Since the oscillation builds up exponentially, it follows that the gain, if considered to be the ratio of the peak oscillation voltage across the tank circuit to the starting signal level, is also an exponential function of the on-time. In other words, the gain in decibels is a linear function of the on-time. This characteristic is ideal for the application of an AGC loop which operates by control of pulse width.

If the control characteristic of the keying pulse generator is made linear and the loop gain is made high, the AGC loop gain and bandwidth will be practically independent of the input signal level. It follows that such an AGC controlled amplifier has a very nearly logarithmic detected output (or AGC voltage) characteristic as a function of the average input voltage level.

It is, therefore, an object of this invention to provide a stable radio frequency amplifier which features gain control by control of the width of the keying pulse.

Another object of the invention is to provide a superregenerative amplifier which will operate in the linear mode and permit linear detection of signal modulation for a wide range of input signal levels.

Still another object of the invention is to provide an automatic gain control for an amplifier in which the bandwidth and shape of the curve of frequency response to input signals and the shape of the gate rejection characteristic are independent of input signal level.

Another object of the present invention is to provide an automatic gain controlled intermediate frequency or radio frequency amplifier having a logarithmic relationship between the input voltage and a detected output voltage.

And yet another object of this invention is to provide a method of duty cycle control or modulation of the power output of high power pulsed oscillators and high power amplifiers.

These and other objects and advantages of the present invention will become more readily apparent and understood from the accompanying specification and single drawing which shows a schematic diagram of one form of automatic gain controlled superregenerative amplifier.

Referring now to the drawing, there is illustrated the basic form of the AGC loop for a superregenerative oscillator circuit employing the principle of AGC by pulse width control. The pulse repetition frequency is generated by a free-running multivibrator type trigger generator 12, which may be synchronized with external equipment at a sync terminal 14. The pulse repetition frequency optionally may be approximately 1000 pulses per second.

This multivibrator trigger generator 12 provides, from output terminals 15 and 17, identical driving pulses to a pair of input terminals 16 and 18 for two thyratrons 42 and 44, respectively, in a thyratron generator 20, which generates the variable width keying pulse. The keying pulse is fed from a terminal 22 to a pulsed oscillator and detector circuit 24 having a keying input terminal 56 and an IF input terminal 62. The resulting detected D.-C. output voltage at a terminal 26 is delivered by means of input terminal 28 to an integrator 30. At an internal summing junction 29 of the integrator 30, this voltage from terminal 28 is compared or added with a D.-C. reference voltage applied at a terminal 32. It is the difference between these two voltage amplitudes, combined by means of resistors 27 and 33, which is integrated. The output voltage of the integrator 30 at a terminal 34 is applied to a pulse width control input terminal 36 of the keying pulse generator 20, thus completing the AGC loop.

The function of the integrator 30 is to furnish the necssary filtering to stabilize the loop and also to furnish a high loop gain at D.-C. The integrator 30 may consist of an operational amplifier 31 having a D.-C. gain of say 30,000, with a capacitive feedback 38. The closed loop tends to stabilize the AGC voltage at a value such that the input junction 29 to the amplifier 31 is zero.

If the amplitude of the detected output were smaller than the amplitude of the threshold control voltage, the integrator output 34 would tend to go negative, but is prevented from so doing by a rectifier 40. Thus, the reference voltage from terminal 32 determines the threshold value of detected output at which AGC action begins. Accordingly, the potentiometer which sets the reference level at terminal 32 will be designated a threshold control 48, as shown in the drawing.

At the left side of the drawing, there will be recognized the typical trigger generator 12 which may be of the free running multivibrator type shown or a one-shot multivibrator type of usual circuitry, either of these may be synchronized with external equipment at terminal 14, if desired. By means of a cathode follower 54, identical driving pulses are provided to input 16 and 18 for the keying pulse generator 20.

The keying pulse generator 20, as shown in the center of the drawing, contains a pair of thyratrons 42 and 44, which are triggered at points 16 and 18, respectively, by the long trigger pulse from the trigger generator circuit 12. By means of different RC time delays and grid biases in the grid circuits 43 and 45 of the two thyratrons 42 and 44, respectively, the thyratrons are caused to fire at different times after the start of the trigger pulse.

In normal operation, the upper thyratron 42 fires first and generates a positive step voltage across a load impedance 46 in its cathode circuit. This positive step has a slow decay time compared to the desired keying pulse width.

A condenser 100 and a resistor 102 are provided in conjunction with thyratron 42 and they function together as a relaxation oscillator. The discharge of condenser 100 through thyratron 42 furnishes the output pulse across the load impedance 46. Once condenser 100 has discharged, thyratron 42 extinguishes and condenser 100 again recharges through the resistor 102 to the positive supply potential at terminal 103.

The subsequent firing of the lower thyratron 44 generates a negative step across the aforementioned load impedance 46, which is also the plate output terminal load of thyratron 44. The positive and negative step voltages, which appear across the load impedance 46, form the output pulse. The time of firing of the lower thyratron 44 and consequently the width of the output pulse is varied by the pulse width control voltage applied at the terminal 36 which varies the thyratron 44 grid bias.

A clipper circuit 50 is provided in the output of the thyratron generator 20 in order to clip the top of the keying pulse so that it will have a flat top. Clipper bias is preferably supplied from an external battery, connected to a terminal 52, so that the bias source may have a low impedance and the clipping level can then be easily varied to control the amplitude of the output pulse.

The pulsed oscillator and detector, which is generally designated by reference numeral 24, is shown on the right side of the drawing. It consists of an oscillator triode tube 60 as shown, or a klystron may be employed for higher frequencies. In either case, the intermediate or radio frequency voltage from terminal 62 is coupled in by means of a variable condenser 64 or other suitable means to a resonant circuit 66.

The keying pulses from terminal 22 may be fed to terminal 56 and thence to the grid input terminal 57 of oscillator 60 as shown, or to a plate input terminal 58 instead of a steady positive plate potential thereon. In either case, detection occurs in the grid of the oscillator 60 and the grid input 57 serves as an amplified and detected signal output connection at a terminal 68 to a pulse stretcher diode 70.

Pulse stretcher diode 70 is preferably preceded by a cathode follower 72, and it delivers useful detected output which may be externally tapped at terminal 26. The threshold control 48 provides a potential at terminal 32 which is summed with the detected output 26 at summing junction 29 of the D.C. amplifier-integrator 30 whose amplified output from terminal 34 is, in turn, connected to the pulse width control input terminal 36 of the lower thyratron 44. Feedback capacitor 38 and rectifier feedback 40 is shown connected to the input and output terminals 29 and 34, respectively for amplifier 31.

The novel feedback circuit principle may be also applied as a method of amplitude modulation of a transmitter oscillator to provide modulated high power microwave oscillations. Microwave oscillators such as klystrons and magnetrons are best adapted to pulsed types of transmission and are hard to modulate by conventional methods, since the amplitude is not a linear function of the anode voltage. The novel feedback-pulse generator circuit finds an important use in preventing drop-out of oscillation or frequency change due to anode voltage change. A modulation input voltage is applied in place of the reference voltage to terminal 32 in the drawing. Modulated radio-frequency power is then taken from the terminal 62.

Obviously many other modifications and variations of the present invention are possible in the light of the above teachings. It is, therefore, to be understood that within the scope of the appended claims the invention may be practiced otherwise than as specifically described.

What is claimed is:

1. A superregenerative amplifier, comprising, means for amplifying an input signal by a superregenerative action, means for detecting the amplitude of the output signal from said amplifying means, a control means, and means for amplifying and filtering the detected output signal from said detecting means and applying the said detected, amplified, filtered output signal to said control means so that said control means controls the gain of said amplifying means by controlling the width of a keying pulse to said amplifying means, thereby forming a closed feedback loop which functions as an automatic gain control circuit.

2. A superregenerative amplifier as recited in claim 1, and means for setting the average level of the output signal of said amplifying means to any desired value.

3. In a circuit arrangement, means including an oscillator in which oscillations are enabled by a keying pulse for the duration of said keying pulse, said keying pulse being of a variable duration which may be equal to or less than the time required for the oscillations to build up to their maximum possible amplitude, and means for controlling the duration of said keying pulse so as to control and modulate the maximum amplitude to which the oscillations build up.

4. In a circuit arrangement, means including an oscillator in which oscillations are enabled by a keying pulse for the duration of said keying pulse, means for receiving a portion of the output of said oscillator and using it to provide said keying pulse so that said duration is less than the time required for the oscillation of said oscillator to build up to maximum amplitude, thereby forming a closed feedback loop which can be used to control and stabilize the maximum amplitude to which the oscillations build up and to modulate the output of said oscillator by means of a modulating signal injected into the control loop.

5. In a circuit arrangement, means for receiving an input signal and amplifying said signal by superregenerative action, and pulse supply means for automatically controlling the gain of said amplifying means in accordance with the width of a keying pulse formed by said pulse supply means and supplied to said amplifying means.

6. In a circuit arrangement, means for receiving an input signal and amplifying said input signal by superregenerative action, and means for receiving the amplified output signal from said amplifying means and utilizing it to provide automatic control of the gain of said amplifying means in accordance with the width of a keying pulse formed by said means for receiving and supplied to said amplifying means.

References Cited in the file of this patent

UNITED STATES PATENTS 2,439,890 Hings ---------------- Apr. 20, 1948

2,467,564 Okrent ---------------- Apr. 19, 1949

2,513,428 Riebman ---------------- July 4, 1950

2,519,359 Dean ---------------- Aug. 22, 1950

2,573,762 Free et al. ---------------- Nov. 6, 1951

2,875,331 Spracklen ---------------- Feb. 24, 1959